US006693453B1

(12) United States Patent
Sheng et al.

(10) Patent No.: US 6,693,453 B1
(45) Date of Patent: Feb. 17, 2004

(54) RE-PROGRAMMABLE LOGIC ARRAY

(75) Inventors: Duo Sheng, Hsinchu (TW); Min Nan Yen, Junghe (CN); Ken Liou, Hsinchu (TW)

(73) Assignee: Macronix International Co., Ltd. (TW)

( * ) Notice: Subject to any disclaimer, the term of this patent is extended or adjusted under 35 U.S.C. 154(b) by 0 days.

(21) Appl. No.: 10/131,718

(22) Filed: Apr. 23, 2002

(51) Int. Cl.$^7$ .................. H03K 19/177; H03K 19/00
(52) U.S. Cl. .......................... 326/39; 326/101
(58) Field of Search .................. 326/37–41, 44–45, 326/47, 49–50, 101

(56) References Cited

U.S. PATENT DOCUMENTS

| | | | | |
|---|---|---|---|---|
| 4,625,130 A | * | 11/1986 | Murray | 326/44 |
| 4,724,341 A | * | 2/1988 | Yamada et al. | 326/108 |
| 4,902,917 A | * | 2/1990 | Simpson | 326/38 |
| 5,387,827 A | * | 2/1995 | Yokoyama et al. | 326/106 |
| 6,020,776 A | * | 2/2000 | Young | 327/408 |

FOREIGN PATENT DOCUMENTS

JP          01109921 A  *  4/1989  ......... H03K/19/177

OTHER PUBLICATIONS

Rhyne, Fundamental of Digital Systems Design, NJ, 1973, pp. 70–71.*
Taub et al., Digital Integrated Electronics, 1977, McGraw–Hill, pp. 98–99.*

* cited by examiner

*Primary Examiner*—James D. Cho
(74) *Attorney, Agent, or Firm*—Martine & Penilla, LLP

(57) ABSTRACT

A re-programmable logic array includes at least one input and at least one output. An input capacitive device is coupled to the at least one input. Internal gating devices are coupled to the input capacitive device, and an output capacitive device is coupled to the internal gating devices and the at least one output. Signal generating circuitry for controlling the internal gating devices is further provided. The internal gating devices are designed to be controlled to establish a connection between one of the at least one input and one of the at least one output.

14 Claims, 6 Drawing Sheets

RE-PROGRAMMABLE LOGIC ARRAY

BACKGROUND OF THE INVENTION

1. Field of the Invention

The present invention relates generally to circuitry, and more particularly, to programmable logic array circuitry that enables flexible programming and re-programming.

2. Description of the Related Art

In some control units, random logic combinational circuits are often required to generate control signals. To implement such functions, PLAs (programmable logic arrays) become a general solution. Traditional PLAs, such as PLA 10 of FIG. 1, are defined as a matrix that includes inverter (INV) arrays 12, AND arrays 14, OR arrays 16, and the like. In such example, the logic gates are electrically connected to one another.

The programming rule is hard-wired by blowing (e.g., burning) fuses 18. The concept and implementation of PLAs are therefore quite straightforward. However, once programming is executed, the PLA can no longer be modified. In other words, it lacks re-programming capability. This drawback therefore introduces a costly inconvenience to both end users as well as system designers. Designers will thus be forced to purchase new hardware to implement a new design change or accommodate some unanticipated use by a customer.

In view of the foregoing, there is a need for a logic array circuitry that can easily be re-programmed to account for changes in design or end-user implementation.

SUMMARY OF THE INVENTION

Broadly speaking, the present invention fills this need by providing programmable logic array circuitry that can easily be re-programmed. The re-programmability of the logic array provides for more flexible design options and reduces the cost of hardware and re-engineering. It should be appreciated that the present invention can be implemented in numerous ways, including as a process, a system, or a device. Several inventive embodiments of the present invention are described below.

In one embodiment, a logic array is provided. The logic array at least one input and at least one output. An input capacitive device is coupled to the at least one input. Internal gating devices are coupled to the input capacitive device, and an output capacitive device is coupled to the internal gating devices and the at least one output. Signal generating circuitry for controlling the internal gating devices is further provided. The internal gating devices are designed to be controlled to establish a connection between one of the at least one input and one of the at least one output.

In another embodiment, a re-programmable logic array (RPLA) is provided. The RPLA includes at least one input and a plurality of outputs. An input capacitive device is coupled to the at least one input. Internal gating devices are coupled to the input capacitive device. A plurality of output capacitive devices is further provided. Each output capacitive device is coupled to one of the internal gating devices and one of the plurality of outputs. Signal generating circuitry is provided for controlling the internal gating devices. The internal gating devices are controlled to establish a connection between one input and one of the plurality of outputs.

In yet another embodiment, a re-programmable logic array (RPLA) is provided. The RPLA includes an input and an output. An input capacitive device is coupled to the input. A plurality of selectable logic blocks is provided. Each selectable logic block is coupled to the input capacitive device. A plurality of internal gating devices is provided, and each of the internal gating devices is coupled to respective ones of the plurality of selectable logic blocks. Further included in the RPLA is an output capacitive device. The output capacitive device is coupled to each of the internal gating devices and the output. Signal generating circuitry for controlling the internal gating devices is provided. The internal gating devices are controlled to establish a connection between the input, one of the selectable logic blocks, and the output.

The advantages of the present invention are numerous. Most notably, however, is that the RPLA of the present invention is more flexible that prior art PLA's that require the blowing of fuses to complete programming designs. By providing the sample and hold (S/H) circuitry of the present invention, generated control signals enable fast and efficient programming of the RPLA. The S/H circuitry, as will be understood by one skilled in the art, will enable synchronization with the system clock (CK) and application to a pipeline system. Furthermore, the RPLA can be re-utilized, which makes hardware circuitry reusable and beneficially enables a reduction in system hardware cost.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION OF THE PREFERRED EMBODIMENTS

An invention is described for programmable logic array circuitry that can easily be re-programmed. Specific details of several embodiments of the present invention are described below. It will be obvious to one skilled in the art, however, that the present invention may be practiced without some or all of these specific details. In other instances, well known process operations have not been described in detail to avoid obscuring the present invention unnecessarily.

Figure 1:
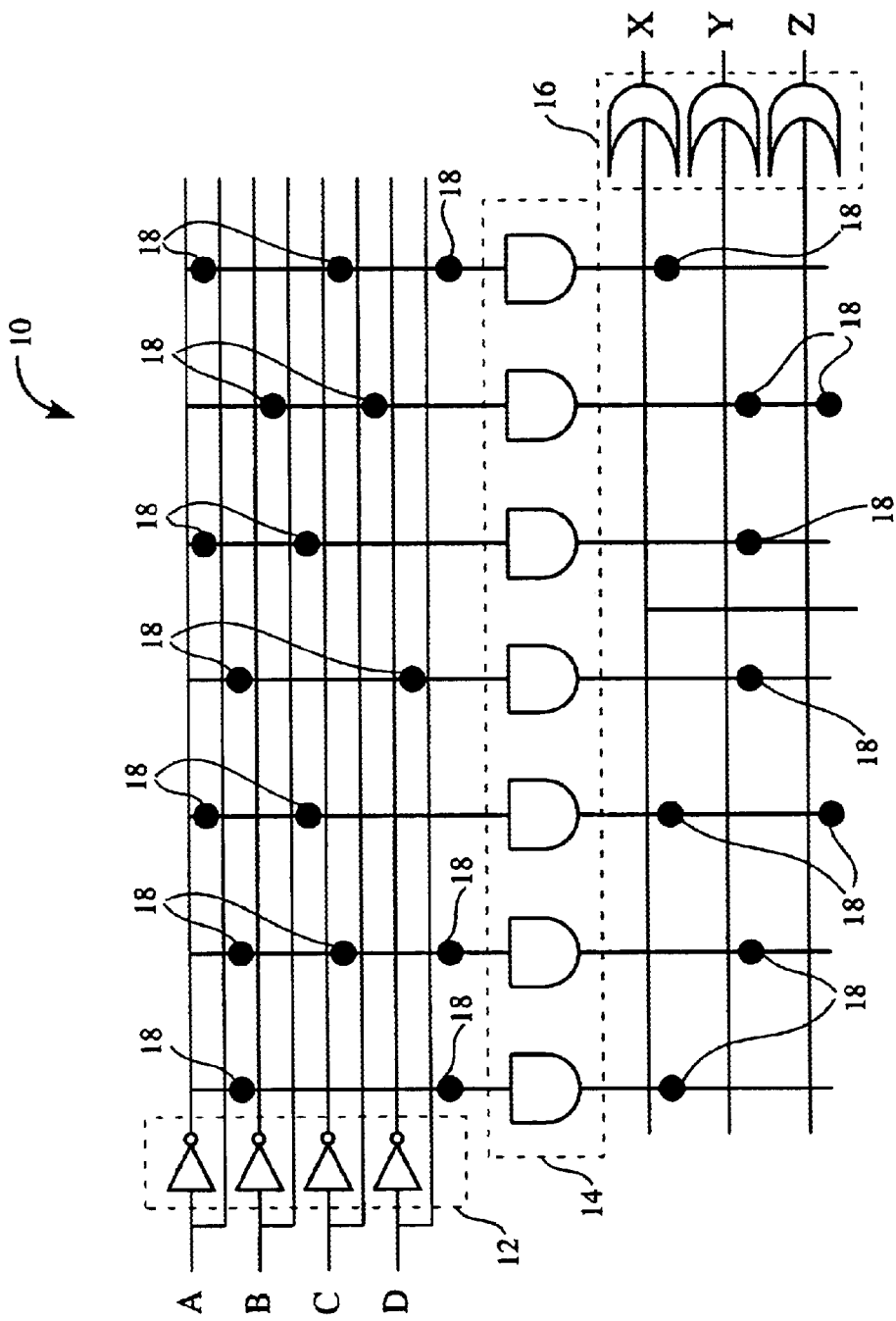
FIG. 1 illustrates a conventional PLA, which is hardwired and not re-programmable.
Figure 2:
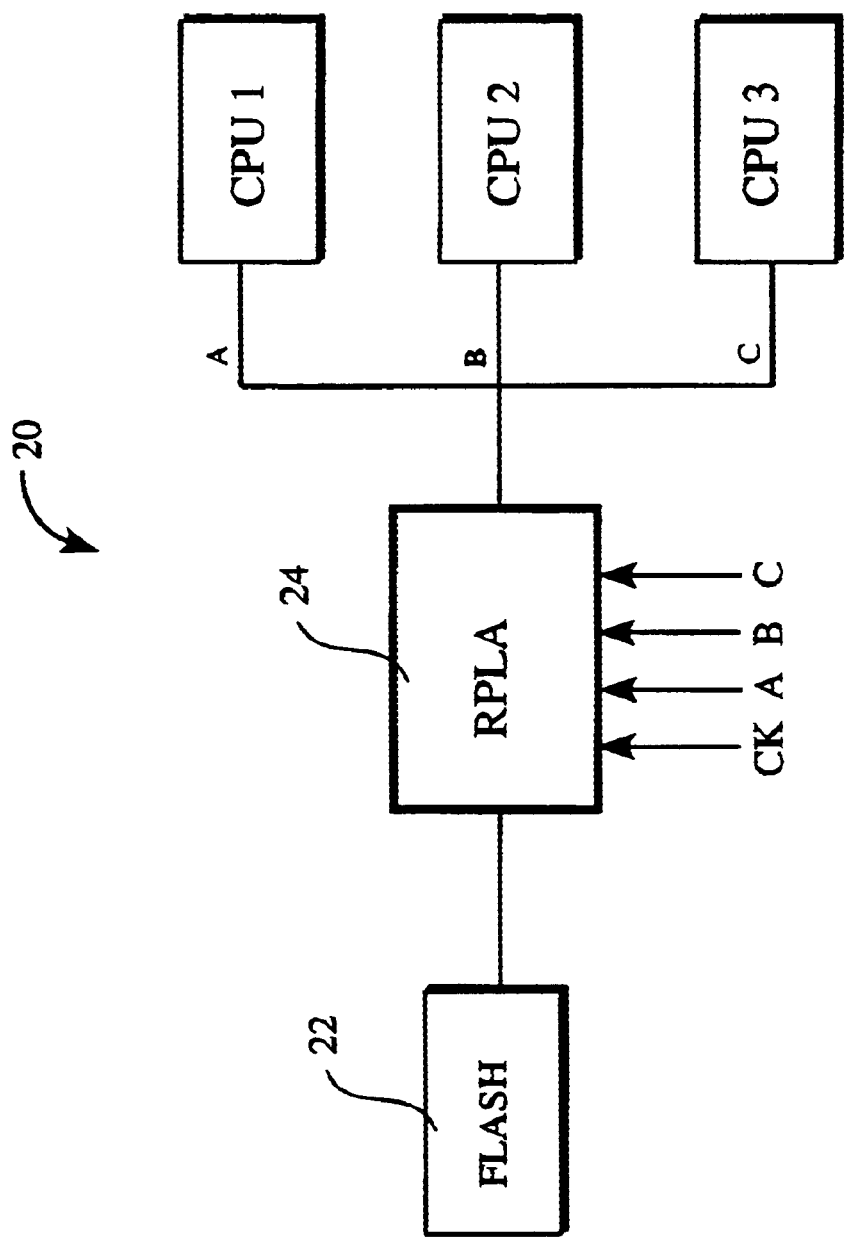
FIG. 2 is a high level illustration of an example interconnection between a memory device and multiple processors.

FIG. 2 illustrates a flash memory 22 being coupled to a re-programmable logic array (RPLA) 24. RPLA 24 is configured to receive a clock CK, signals A, B, and C. PLA 24 is further coupled to a number of central processing units (CPUs), such as CPU1, CPU2 and CPU3. RPLA 24 is shown providing more than one CPU access to a single memory (i.e., flash memory 22). Thus, RPLA 24 is required to control which CPU executes the accessing operation to the memory, and such control results in different consequences depending on timing. In one embodiment, the RPLA 24 is able to be re-programmed in response to various programming control signals, which are applied at appropriate times. In contrast, the prior art PLA 10 of FIG. 1 is not able to be re-programmed, and thus cannot provide the functionality that is provided by RPLA 24.

In accordance with one aspect of the present invention, the RPLA 24 is designed with specialized sample and hold (S/H) circuitry. The S/H circuitry is configured to be synchronized with the system clock (CK) of a particular design. Such circuitry is also well suited to be applied to a pipeline system.

Figure 3:
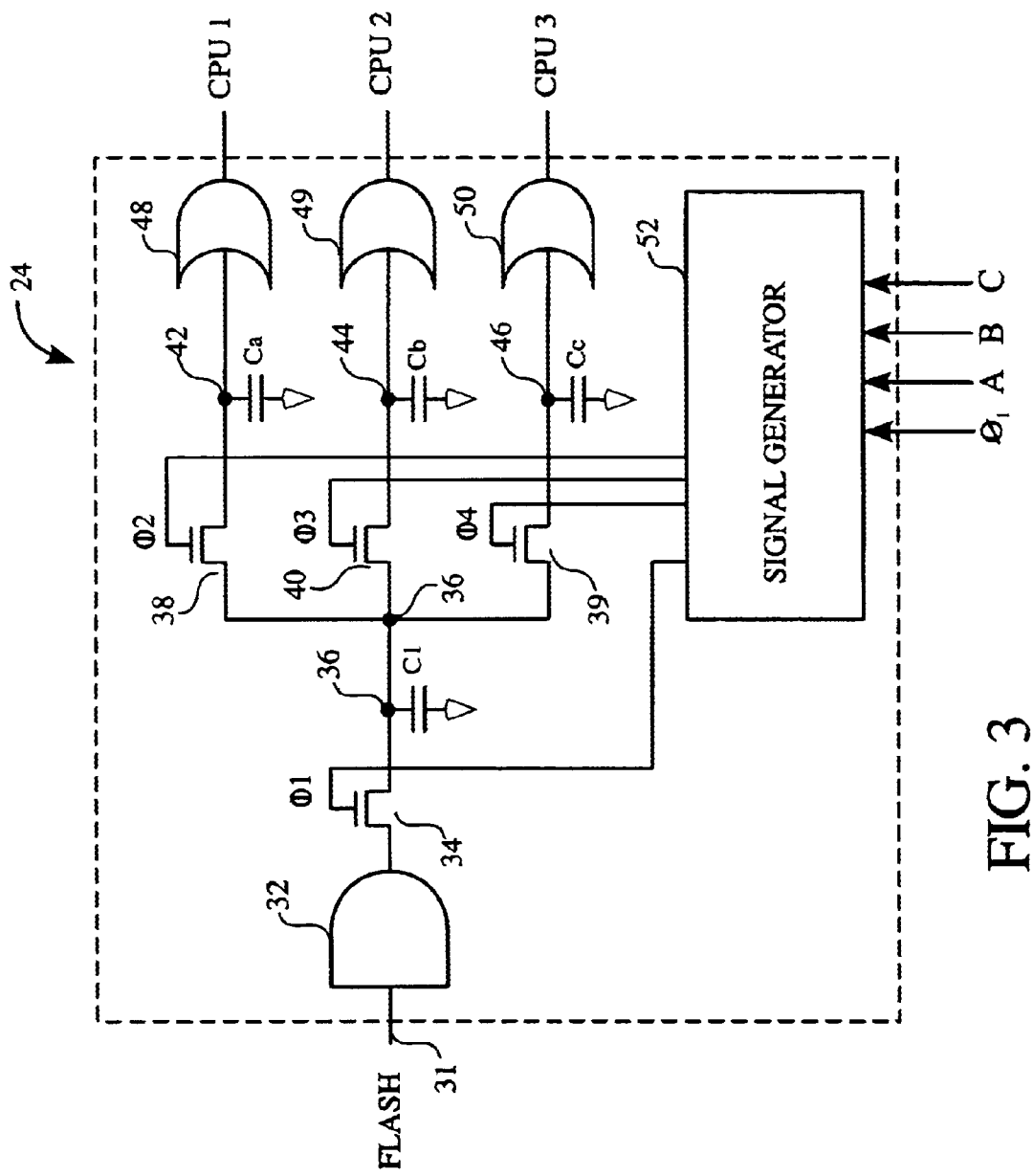
FIG. 3 illustrates in more detail exemplary circuitry for enabling the re-programmable logic array.

FIG. 3 illustrates a circuit diagram of a re-programmable logic array (RPLA), in accordance with one embodiment of the present invention. The RPLA 24 is coupled to the flash memory 22 via a bus 31. Bus 31 is coupled to an AND gate 32. The AND gate 32 is connected to a terminal of transistor 34, which functions as an enabling transistor. Transistor 34 has its gate connected to $\phi_1$. Transistor 34 has its other terminal connected to a node 36. Node 36 is connected to a capacitor $C_1$, which is further coupled to ground. Capacitor $C_1$ will thus function as a temporary storage. Node 36 is also coupled to a terminal of each of transistors 38, 40, and 39. Transistor 38 has its gate coupled to $\phi_2$, transistor 40 has its gate coupled to $\phi_3$, and transistor 39 has its gate coupled to $\phi_4$.

Each of $\phi_1$, $\phi_2$, $\phi_3$, and $\phi_4$ is defined as a control signal and is provided by circuitry of a signal generator 52. As shown, signal generator 52 is configured to receive signals $\phi_1$, A, B, and C. The other terminals of transistors 38, 40, and 39 are coupled respectively to nodes 42, 44, and 46. Node 42 is coupled to a capacitor $C_a$, node 44 is coupled to a capacitor $C_b$, and node 46 is coupled to a capacitor $C_c$. Each of capacitors $C_a$, $C_b$, and $C_c$ is thus a capacitor for temporary storage. Nodes 42, 44, and 46 are thus provided as inputs to OR gates 48, 49, and 50, respectively. The outputs of OR gates 48, 49, and 50 will therefore couple to some other devices, or in this specific example, central processing units (CPUs) 1, 2, and 3, respectively.

With continuing reference to FIG. 3, the architecture diagram of the RPLA 24 is provided with the aforementioned S/H circuitry. In operation, when data is to be sent to a designated CPU (e.g., CPU1, CPU2, CPU3) by flash memory 22, $\phi_1$ is logic 1. As defined herein, therefore, $\phi_1$ is an enabling signal. In this state, data will be stored in C1, while $\phi_2$, $\phi_3$, $\phi_4$ are logic 0. On the other hand, when $\phi_1$ is logic 0, data is sent to one of the CPUs depending on which one of $\phi_2$, $\phi_3$, and $\phi_4$ is logic 1. In this manner, the destination address of data can be flexibly determined. Similarly, when data is to be sent to flash memory 22 by one of CPUs, the CPU allowed to communicate such data to the flash memory is determined based on which of $\phi_2$, $\phi_3$, or $\phi_4$ is logic 1.

Figure 4:
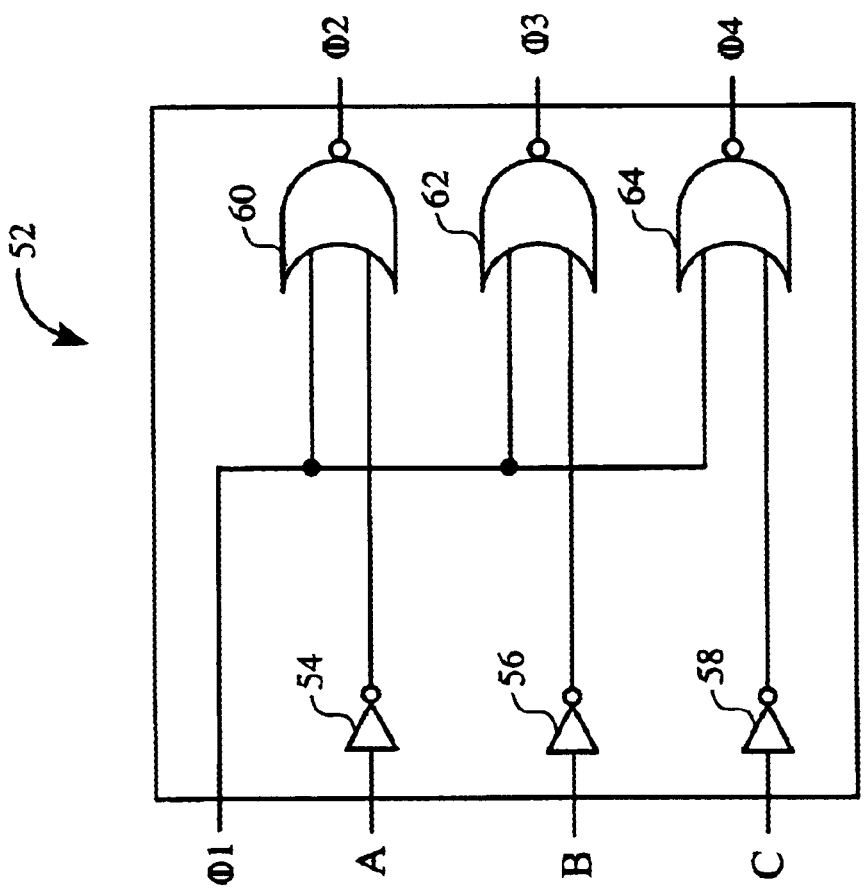
FIG. 4 is a circuit diagram of a signal generator, in accordance with one embodiment of the present invention.

FIG. 4 illustrates a more detailed diagram of the signal generator 52 of FIG. 3, in one embodiment of the present invention. As shown, $\phi_1$, A, B, and C are provided as inputs to the signal generator 52. Each of signal inputs A, B, and C is passed through inverters 54, 56, and 58, respectively. The inverted signals are then provided as inputs to NOR gates 60, 62, and 64. The second input to the NOR gates 60 is provided as control signal $\phi_1$. In this manner, NOR gate 60 will generate an output $\phi_2$, NOR gate 62 will produce an output $\phi_3$, and NOR gate 64 will produce an output $\phi_4$.

Accordingly, the outputs $\phi_2$, $\phi_3$, and $\phi_4$ are provided to the respective transistors as illustrated and discussed with reference to FIG. 3.

Still referring to FIG. 4, the signal generator 52 is provided to enable efficient generation of control signals $\phi_2$, $\phi_3$, $\phi_4$. As a result, the inputs provided on $\phi_1$, A, B, and C will determine what control signals $\phi_2$, $\phi_3$, and $\phi_4$ are activated. As mentioned above, the control signals $\phi_2$, $\phi_3$, and $\phi_4$ will in turn transfer the appropriate programming to the logic arrays. This flexible programming capability will therefore eliminate the need to replace hardware logic arrays to enable new operating schemes or to simply allow for more flexible interfacing with multiple inputs, multiple outputs, or combinations of multiple inputs and outputs as will be discussed with reference to FIGS. 5 and 6.

Figure 5:
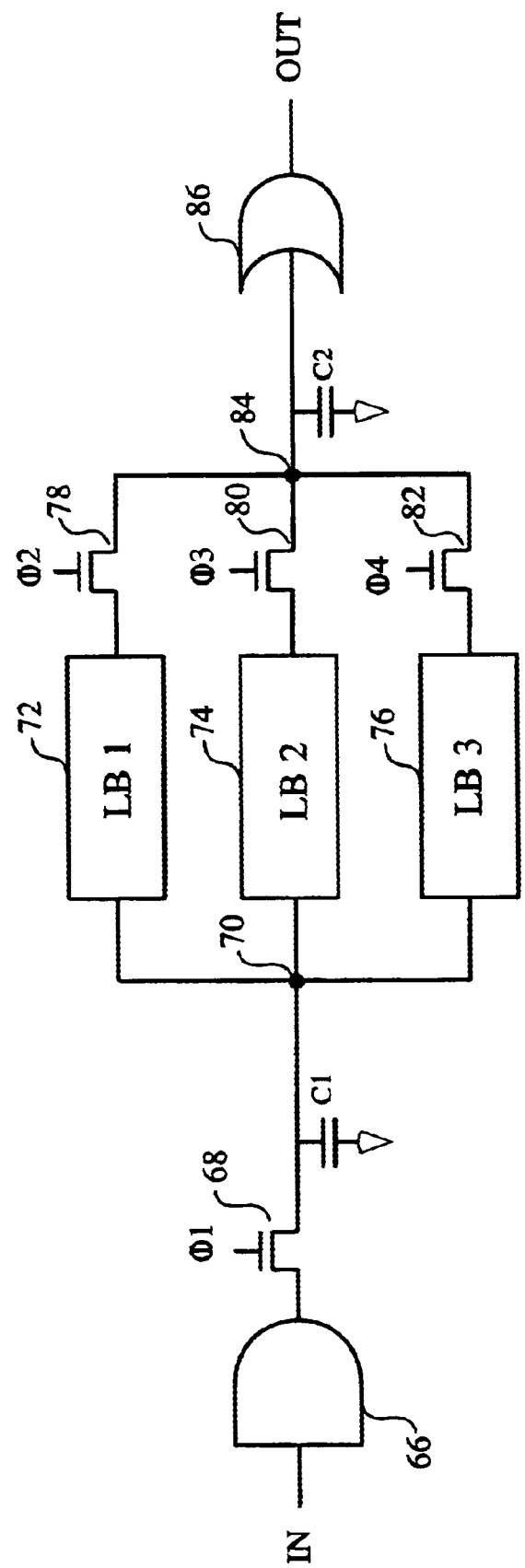
FIG. 5 shows an alternative implementation of the RPLA to interconnect a selected logic block between one input and one output.

FIG. 5 illustrates an alternative embodiment in which one of logic blocks (LB) 1, 2, or 3 is connected between an input (IN) and an output (OUT). As shown, the input is provided to AND gate 66 which provides its output to a terminal of transistor 68. The gate of transistor 68 is coupled to $\phi_1$. The other terminal of transistor 68 is coupled to node 70. A capacitor $C_1$ is coupled to node 70. Node 70 is likewise connected to each of logic blocks LB1 72, LB2 74, and LB3 76.

The output of LB1 72 is connected to a terminal of transistor 78, which has its gate connected to $\phi_2$. The other terminal of transistor 78 is coupled to node 84. The output of LB2 74 is connected to a terminal of transistor 80. The gate of transistor 80 is connected to $\phi_3$, and the other terminal of transistor 80 is connected to node 84. The output of LB3 76 is connected to a terminal of transistor 82. Transistor 82 has its gate connected to $\phi_4$. The other terminal of transistor 82 is then connected to node 84. Accordingly, a terminal of each of transistors 78, 80, and 82 is connected to node 84, which is also coupled to a capacitor $C_2$. Node 84 further defines the input to an OR gate 86, which then provides the output (OUT). In this example, therefore, it is possible to connect one input to one output, while programmably connecting to a desired one of multiple logic blocks (LBs).

Figure 6:
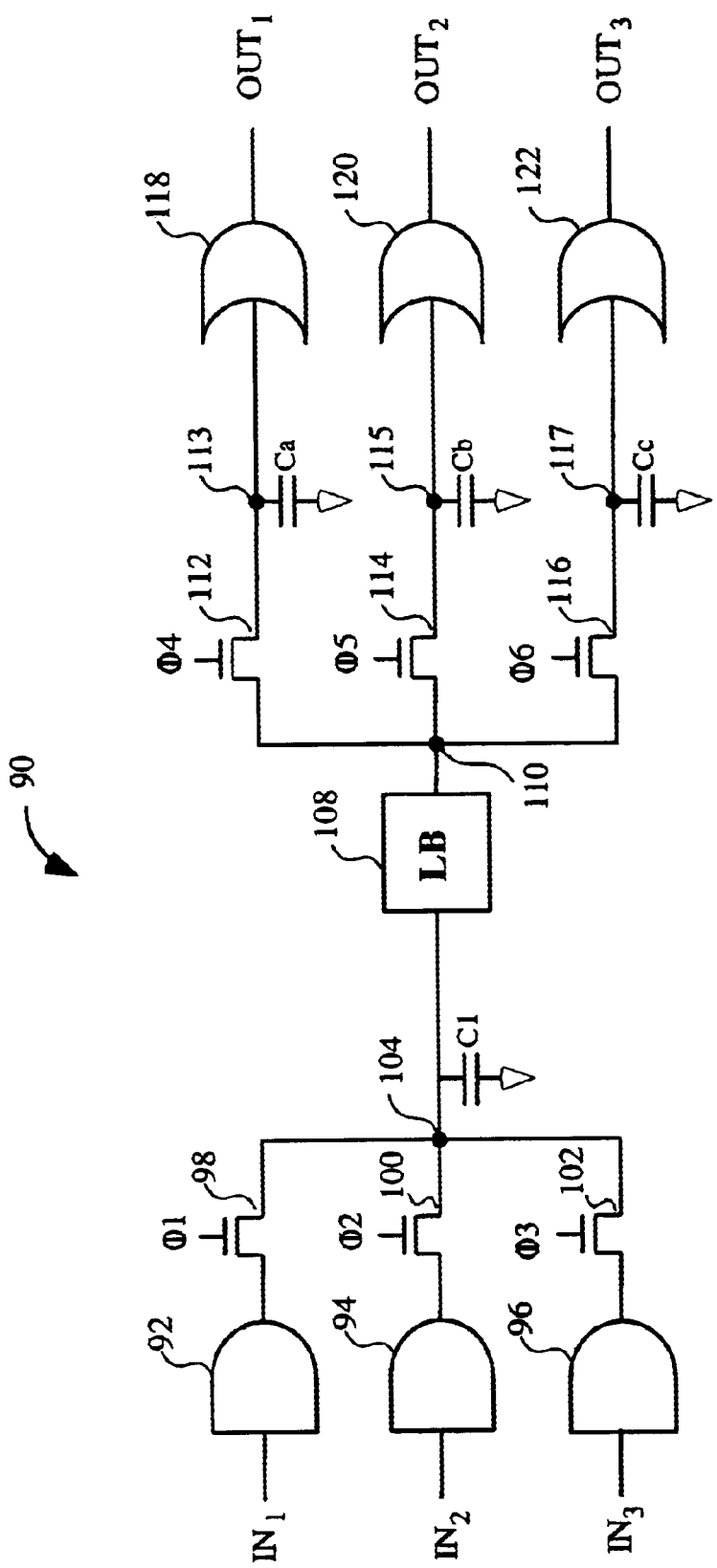
FIG. 6 shows yet another alternative implementation of the RPLA to interconnect one of multiple inputs to one of multiple outputs.

FIG. 6 illustrates yet another embodiment in accordance with the present invention. In this embodiment, connection is selected from one of the inputs (e.g., $IN_1$, $IN_2$, or $IN_3$) to one of the outputs (e.g., $OUT_1$, $OUT_2$, or $OUT_3$). As illustrated, input $IN_1$, is connected to an AND gate 92. The output of AND gate 92 is coupled to a terminal of transistor 98. The gate of transistor 98 is connected to $\phi_2$. The input $IN_1$ is shown connected to AND gate 94, which has its output connected to a terminal of transistor 100. Transistor 100 has its gate connected to $\phi_2$. The input $IN_3$ is shown connected to AND gate 96, which has its output connected to a terminal of transistor 102. Transistor 102 has its gate connected to $\phi_3$. A node 104 is thus connected to the remaining terminal of each of transistors 98, 100, and 102. Node 104 is further shown connected to logic block 108, and a capacitor $C_1$ is coupled to node 104.

A node 110 is coupled to the output of logic block (LB) 108. Node 110 is thus connected to a terminal of each of transistors 112, 114, and 116. The gates of transistors 112, 114, 116 are respectively coupled to $\phi_4$, $\phi_5$, and $\phi_6$. The remaining terminals of transistors 112, 144, and 116, are coupled respectively to nodes 113, 115, and 117. Node 113 is coupled to a capacitor $C_a$. Node 113 further defines the input to OR gate 118 that defines output ($OUT_1$). Node 115 is further shown coupled to a capacitor $C_b$. Node 115 defines the input of OR gate 120 that outputs $OUT_2$. Finally, node 117 is connected to a capacitor $C_c$. Node 117 defines the input to OR gate 122 that defines $OUT_3$. In this manner, by controlling the signals provided to $\phi_1$ through $\phi_6$, it is possible to define a programmable connection between one of the inputs $IN_1$–$IN_3$, to one of the outputs $OUT_1$–$OUT_3$.

From the described embodiments, it is evident that the RPLA of the present invention is very flexible in establishing controlled re-programmed states. These re-programmed states therefore enable precision interconnection with selected inputs and selected outputs, while the S/H circuitry enables synchronization with the system clock (CK), and application to a pipeline system. The re-utilization of the RPLA circuitry for different implementations thus beneficially enables a reduction in system hardware cost.

The invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated in connection or interface with the RPLA circuitry defined herein. Further, the manipulations performed are often referred to in terms, such as producing, identifying, determining, or comparing.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A logic array, comprising:
   at least one input, the at least one input being coupled to an AND gate that outputs to an enabling transistor;
   at least one output;
   an input capacitor device coupled to the at least one input;
   internal gating devices coupled to the input capacitor device;
   an output capacitor device coupled to the internal gating devices and the at least one output; and
   signal generating circuitry for controlling the internal gating devices, the signal generating circuitry being coupled to the enabling transistor, and the internal gating devices being controlled to establish a connection between one of the at least one input and one of the at least one output.

2. The logic array as recited in claim 1, wherein the internal gating devices are transistors having transistor gates coupled to the signal generating circuitry.

3. The logic array as recited in claim 1, wherein the signal generating circuitry receives an enabling signal and a plurality of signal inputs, the plurality of signal inputs being coupled to a plurality of invertors which output to a plurality of NOR gates, and the plurality of NOR gates further being configured to receive as inputs the enabling signal.

4. The logic array as recited in claim 3, wherein the plurality of NOR gates generates control signals that couple to the internal gating devices.

5. A re-programmable logic array, comprising:
   at least one input the at least one input being coupled to an AND gate that outputs to an enabling transistor;
   a plurality of outputs;
   an input capacitor device coupled to the at least one input;
   internal gating devices coupled to the input capacitor device;
   a plurality of output capacitor devices, each output capacitor device being coupled to one of the internal gating devices and one of the plurality of outputs; and
   signal generating circuitry for controlling the internal gating devices, the signal generating circuitry providing an enabling signal, the internal gating devices being controlled to establish a connection between one of the at least one input and one of the plurality of outputs, and wherein the enabling transistor is coupled to the enabling signal.

6. The re-programmable logic array as recited in claim 5, wherein the internal gating devices are transistors having transistor gates coupled to the signal generating circuitry.

7. The re-programmable logic array as recited in claim 6, wherein each transistor of the internal gating devices is coupled between the input capacitor device and the output capacitor devices.

8. The re-programmable logic array as recited in claim 5, wherein the signal generating circuitry receives an enabling signal and a plurality of signal inputs, the plurality of signal inputs being coupled to a plurality of invertors which output to a plurality of NOR gates, and the plurality of NOR gates further being configured to receive as inputs the enabling signal.

9. The re-programmable logic array as recited in claim 5, wherein each of the plurality of output capacitor devices is coupled to one of a plurality of NOR gates, and the output of each of the plurality of NOR gates defines an output of the re-programmable logic array.

10. The re-programmable logic array as recited in claim 9, wherein each of the plurality of NOR gates outputs to a corresponding central processing unit, and the at least one input is connected to a flash memory.

11. A re-programmable logic array, comprising:
    an input;
    an output;
    an input capacitor device coupled to the input;
    a plurality of selectable logic blocks, each being coupled to the input capacitor device;
    a plurality of internal gating devices, each of the internal gating devices being coupled to respective ones of the plurality of selectable logic blocks;
    an output capacitor device, the output capacitor device being coupled to each of the internal gating devices and the output; and
    signal generating circuitry for controlling the internal gating devices, the signal generating circuitry receiving an enabling signal and a plurality of signal inputs, the plurality of signal inputs being coupled to a plurality of invertors that output to a plurality of NOR gates, the plurality of NOR gates further being configured to receive as inputs the enabling signal, and the internal gating devices being controlled to establish a connection between the input, one of the selectable logic blocks, and the output.

12. The re-programmable logic array as recited in claim 11, wherein the internal gating devices are transistors having transistor gates coupled to the signal generating circuitry.

13. The re-programmable logic array as recited in claim 11, wherein the input connects to the input capacitor device through an AND gate.

14. The re-programmable logic array as recited in claim 11, wherein the output capacitor device connects to the output through a NOR gate.

* * * * *